(12) United States Patent
Naito

(10) Patent No.: US 9,117,307 B2
(45) Date of Patent: Aug. 25, 2015

(54) METHOD FOR CREATING FINITE ELEMENT MODEL OF RUBBER COMPOSITE

(75) Inventor: Masato Naito, Kobe (JP)

(73) Assignee: SUMITOMO RUBBER INDUSTRIES, LTD., Kobe-Shi (JP)

( * ) Notice: Subject to any disclaimer, the term of this patent is extended or adjusted under 35 U.S.C. 154(b) by 635 days.

(21) Appl. No.: 13/288,112

(22) Filed: Nov. 3, 2011

(65) Prior Publication Data

US 2012/0239351 A1    Sep. 20, 2012

(30) Foreign Application Priority Data

Mar. 18, 2011 (JP) ................................. 2011-061265

(51) Int. Cl.
*G06F 17/10* (2006.01)
*G06T 17/20* (2006.01)
*G06F 17/50* (2006.01)

(52) U.S. Cl.
CPC ............ *G06T 17/20* (2013.01); *G06F 17/5018* (2013.01)

(58) Field of Classification Search
CPC ........................... G06F 17/5018; G06T 17/20
USPC ............................................................. 703/2
See application file for complete search history.

(56) References Cited

U.S. PATENT DOCUMENTS

| | | | |
|---|---|---|---|
| 6,282,849 B1 * | 9/2001 | Tuczek | 52/81.1 |
| 7,292,966 B2 * | 11/2007 | Naito | 703/6 |
| 2004/0075655 A1 * | 4/2004 | Dunnett | 345/418 |
| 2006/0106586 A1 | 5/2006 | Naito | |
| 2010/0225057 A1 * | 9/2010 | Akiyama et al. | 273/153 S |
| 2012/0226482 A1 * | 9/2012 | Wu et al. | 703/2 |

* cited by examiner

*Primary Examiner* — Aniss Chad
*Assistant Examiner* — Andre Pierre Louis
(74) *Attorney, Agent, or Firm* — Birch, Stewart, Kolasch & Birch, LLP

(57) ABSTRACT

A method for creating a 2D or 3D finite element model of a rubber composite of a rubber matrix and fillers are disclosed. The method comprises a first step in which a region of the rubber matrix and a plurality of regions of the fillers are defined in a predetermined 2D or 3D space; a second step in which the regions of the rubber matrix and fillers are divided into primary elements to form a primary finite element model, wherein the primary elements are triangular elements and optional quadrilateral elements when the space is two-dimensional or tetrahedral elements and optional hexahedron elements when the space is three-dimensional; and a third step in which each of the primary elements is subdivided into quadrilateral elements when the space is two-dimensional or hexahedron elements when the space is three-dimensional.

2 Claims, 14 Drawing Sheets

METHOD FOR CREATING FINITE ELEMENT MODEL OF RUBBER COMPOSITE

CROSS REFERENCE

The present application claims priority to Japanese Application No. 2011-061265 filed on Mar. 18, 2011. The entire contents of this application is hereby incorporated by reference.

BACKGROUND OF THE INVENTION

The present invention relates to a computerized method for creating a two-dimensional or three-dimensional finite element model of a rubber composite comprising a rubber matrix and fillers, capable of improving the accuracy of computer simulations and reducing the processing time for creating the finite element model.

In recent years, various computer simulations utilizing a finite element method are widely employed.
In such a simulation, in order that a computer can deal with the analysis object, the analysis object is discretized into a finite number of elements to create a finite element model of the analysis object. The finite element model is provided with various characteristics, and a deformation calculation in which displacements of nodes of the elements are calculated, is made.

Finite element models may be created by various methods.
In the case that the analysis object is a rubber composite (b) in which fillers (c) are dispersed in a rubber matrix (d) as shown in FIG. 14, and to be created is a two-dimensional finite element model, as shown in FIG. 15(a) for example, regions (h) in which the filler (c) reside and a region (g) in which the rubber matrix (d) resides are defined in a predetermined two-dimensional space (i), and a finite element model (a) in which these regions are each discretized by the use of triangular elements (e) is created.

Meanwhile, as the rubber has incompressibility, such incompressible material characteristic is defined on each of the triangular elements (e) of the rubber matrix's region (g). Therefore, when a side of the triangular element (e) of the rubber matrix's region (g) is connected to the region (h) of the filler which is defined as having a higher rigidity than the rubber matrix, the triangular element (e) is restrained and the degrees of freedom of its deformation is greatly decreased.
As a result, in the part (or elements) of the rubber matrix abutting the fillers, the rigidity of the rubber matrix is calculated as if it is higher than it really is, and thereby the simulation accuracy is decreased.

On the other hand, in a finite element model (a) made up of quadrilateral elements (f) as shown in FIG. 15(b), even if a side of the quadrilateral element (f) of the rubber matrix's region (g) is connected to the region (h) of the filler, as the degrees of freedom of deformation of the quadrilateral element is high when compared with the triangular element (e) as shown in FIG. 15(a), there is less possibility of the above-mentioned overestimation of the rigidity in the abutting part.
In the case of a finite element model made up of quadrilateral elements (f), in comparison with the triangular elements (e), it is difficult for the computer or meshing software to automatically divide a region of a filler having a round shape into quadrilateral elements, and manual procedures are necessitated, therefore, the creating the finite element model takes a lot of time and effort.
This is also true in the case of a three-dimensional finite element model using hexahedron elements.

Namely, to create a three-dimensional finite element model made up of tetrahedral elements is relatively easy, but there is a possibility of the overestimation of the rigidity of the rubber matrix in the part abutting the fillers because the degrees of freedom of deformation of a tetrahedral element is low, and if one of four faces of a tetrahedral element is connected to the region of the filler, the degrees of freedom of its deformation is greatly decreased.

If a three-dimensional finite element model made up of hexahedron elements is used, there is less possibility of the overestimation of the rigidity because the degrees of freedom of deformation of a hexahedron element is relatively high. However, the creating the finite element model takes more complicated tasks than 2D and a lot of time.

SUMMARY OF THE INVENTION

It is therefore, an object of the present invention to provide a method for creating a two-dimensional or three-dimensional finite element model of a rubber composite, in which regions of the rubber matrix and fillers are divided in two steps so that the first and second dividing operations become easy for a computer, and the finite element model with which simulation accuracy can be improved is created in a short time without the need for manual procedures.

According to one aspect of the present invention, a computerized method for creating a two-dimensional finite element model of a rubber composite of a rubber matrix and fillers, comprises a first step in which a region of the rubber matrix and a plurality of regions of the fillers are defined in a predetermined two-dimensional space, and coordinates of these regions defined are stored in a memory of a computer, a second step in which, with the computer, each of the rubber matrix's region and the fillers' regions is divided into a plurality of triangular elements, and a third step in which, with the computer, each of the triangular elements is subdivided into three quadrilateral elements, whereby the two-dimensional finite element model made up of the quadrilateral elements is created.

According to another aspect of the present invention, a computerized method for creating a three-dimensional finite element model of a rubber composite of a rubber matrix and fillers, comprises a first step in which a region of the rubber matrix and a plurality of regions of the fillers are defined in a predetermined three-dimensional space, and coordinates of these regions defined are stored in a memory of a computer, a second step in which, with the computer, each of the rubber matrix's region and the fillers' regions is divided into a plurality of tetrahedral elements, and a third step in which, with the computer, each of the tetrahedral elements of the rubber matrix's region and fillers' regions is subdivided into four hexahedron elements, whereby the three-dimensional finite element model made up of the hexahedron elements is created.

DESCRIPTION OF THE PREFERRED EMBODIMENTS

Embodiments of the present invention will now be described in detail in conjunction with the accompanying drawings.

In the method according to the present invention, a two-dimensional or three-dimensional finite element model (2, 20) of a rubber composite (b) comprising a rubber matrix (d) and fillers (c) dispersed therein is created by the use of a computer 1 in order to simulate deformation of the rubber composite (b) by the use of the computer 1.

As to the simulation method, various methods may be employed regardless of known or unknown types, therefore, the description is omitted here.

The fillers (c) are fine particles having rigidity higher than the rubber matrix (d), for example, carbon black, silica and the like, and each filler (c) is treated as having a round shape. In the case of two-dimensional model, the "round shape" means a circle, oval and the like. In the case of three-dimensional model, the "round shape" means a sphere, spheroid and the like.

Figure 1:
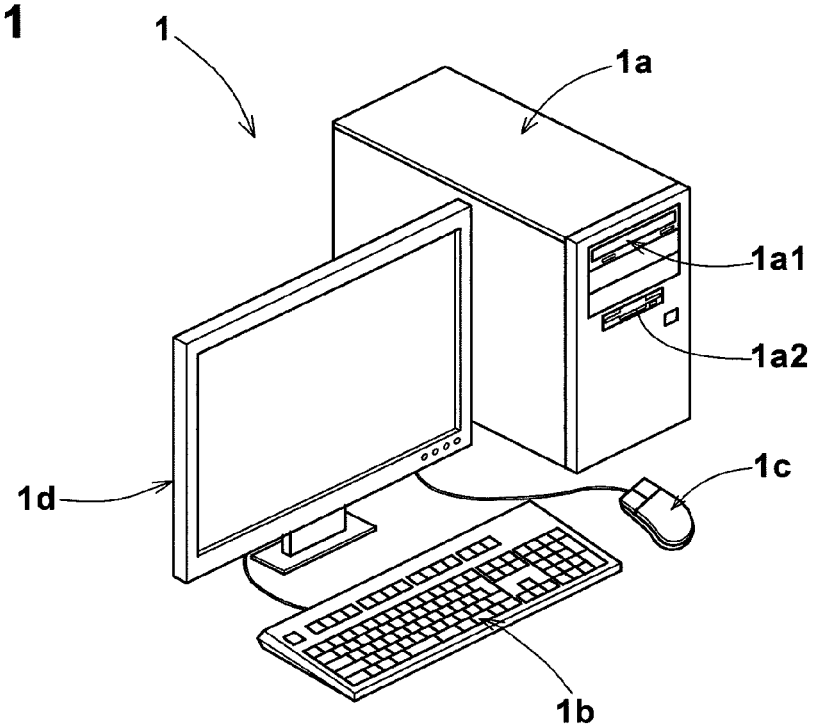
FIG. 1 is shows a computer for executing the method according to the present invention.

As for the computer 1, a general-purpose computer such as workstation can be used. For example, as shown in FIG. 1, the computer 1 comprises a main body 1a, a keyboard 1b, a mouse 1c and a display 1d. The main body 1a comprises an arithmetic processing unit (CPU), ROM, working memory, storage devices such as magnetic disk, disk drives 1a1 and 1a2 and the like. In the storage device, programs/softwares for carrying out the creating method are stored.

Figure 2:
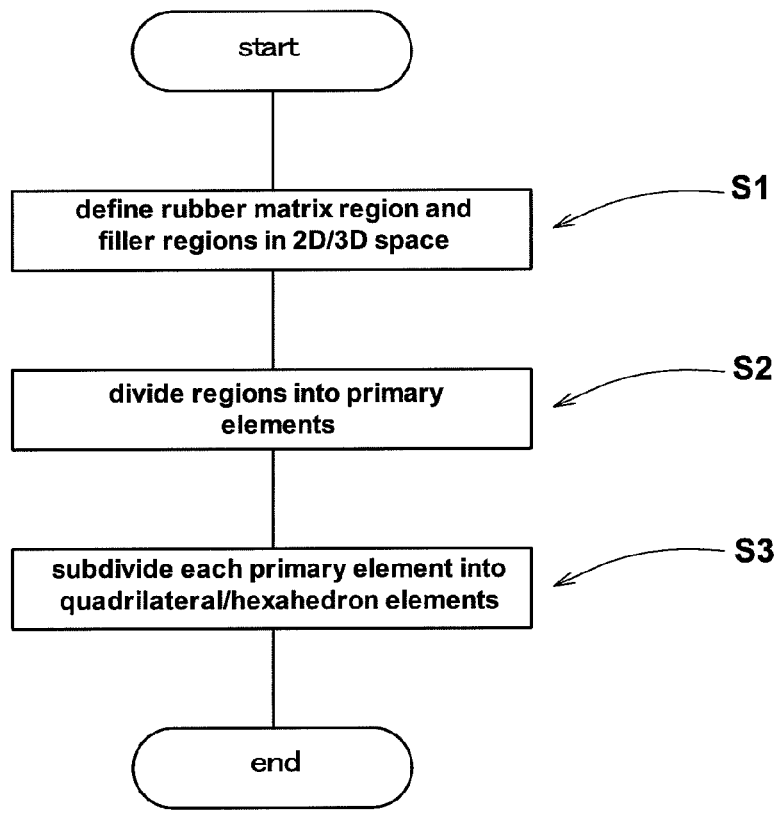
FIG. 2 is a flowchart of the method according to the present invention.

According to the present invention, as shown in FIG. 2, the method for creating the finite element model (2, 20) of the rubber composite (b) comprises a first step S1 in which a region of the rubber matrix and a plurality of regions of the fillers are defined in a predetermined 2D or 3D space, a second step S2 in which the regions of the rubber matrix and fillers are divided into primary elements to form a primary finite element model, and a third step S3 in which each of the primary elements is subdivided into quadrilateral elements when the space is two-dimensional or hexahedron elements when the space is three-dimensional.

First Embodiment

Two-Dimensional Finite Element Model 2

Figure 5A:
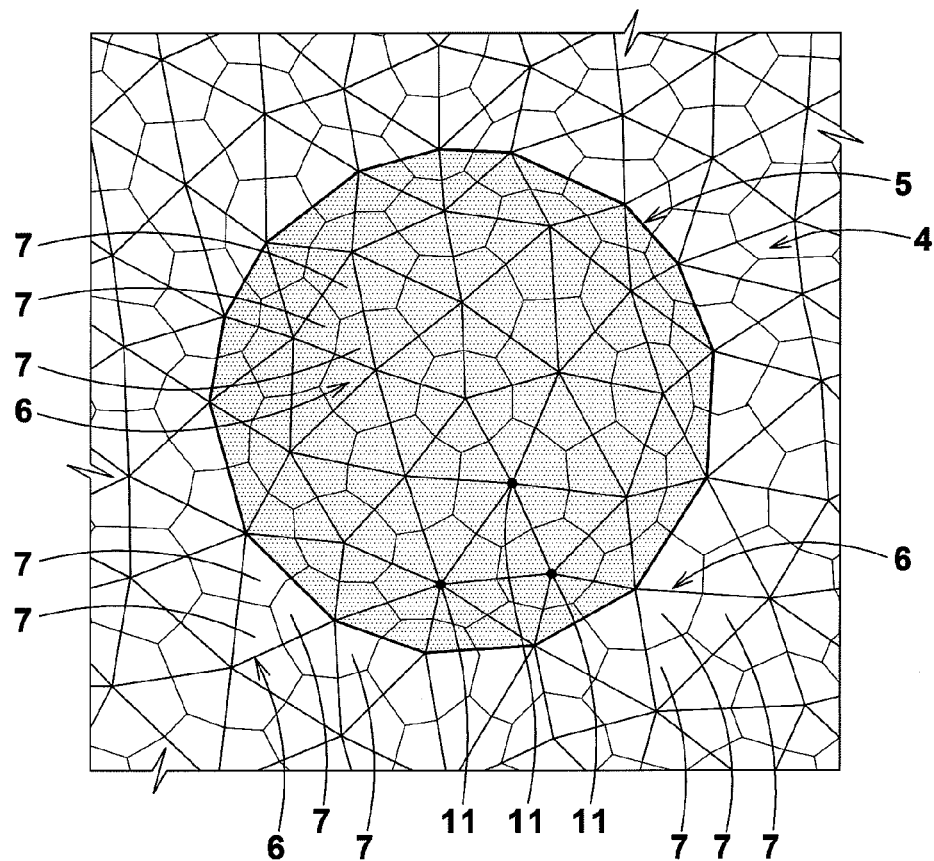
FIG. 5(a) shows the two-dimensional finite element model of the rubber composite.

In the method according to the first embodiment of the present invention, a two-dimensional finite element model 2 (shown in FIG. 5(a)) of a rubber composite (shown in FIG. 14) is created.

FIG. 2 shows a flowchart of the method in this embodiment, wherein:—

Figure 3:
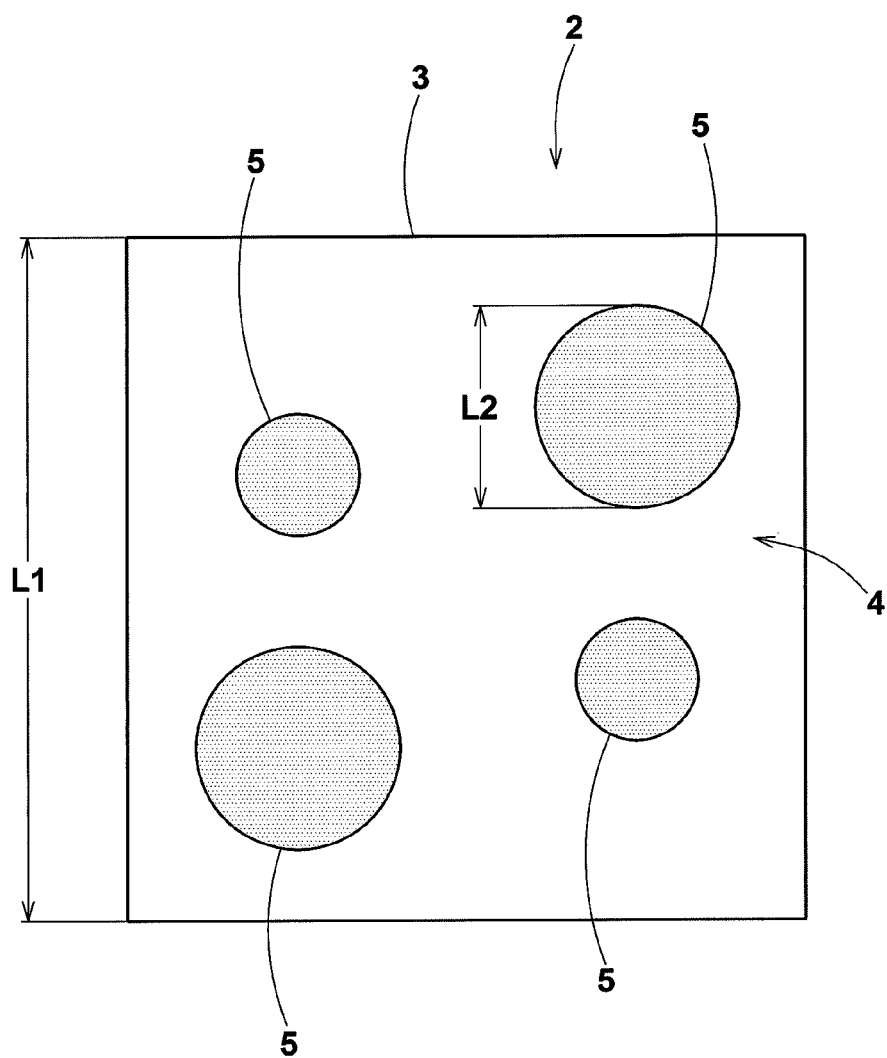
FIG. 3 shows a two-dimensional space in which regions of fillers and a region of a rubber matrix are defined.

In the first step S1, as shown in FIG. 3, a region 4 of the rubber matrix (d) and regions 5 of the fillers (c) are defined in a predetermined two-dimensional space 3.

For example, the two-dimensional space 3 has a square shape of which each side has a length L1 of about 50 to 150 nm, and each of the fillers' regions 5 has a circular shape of which diameter L2 is about 5 to 50 nm.

with the computer 1, the coordinates of each region 4, 5 are stored in the memory.

Figure 4A:
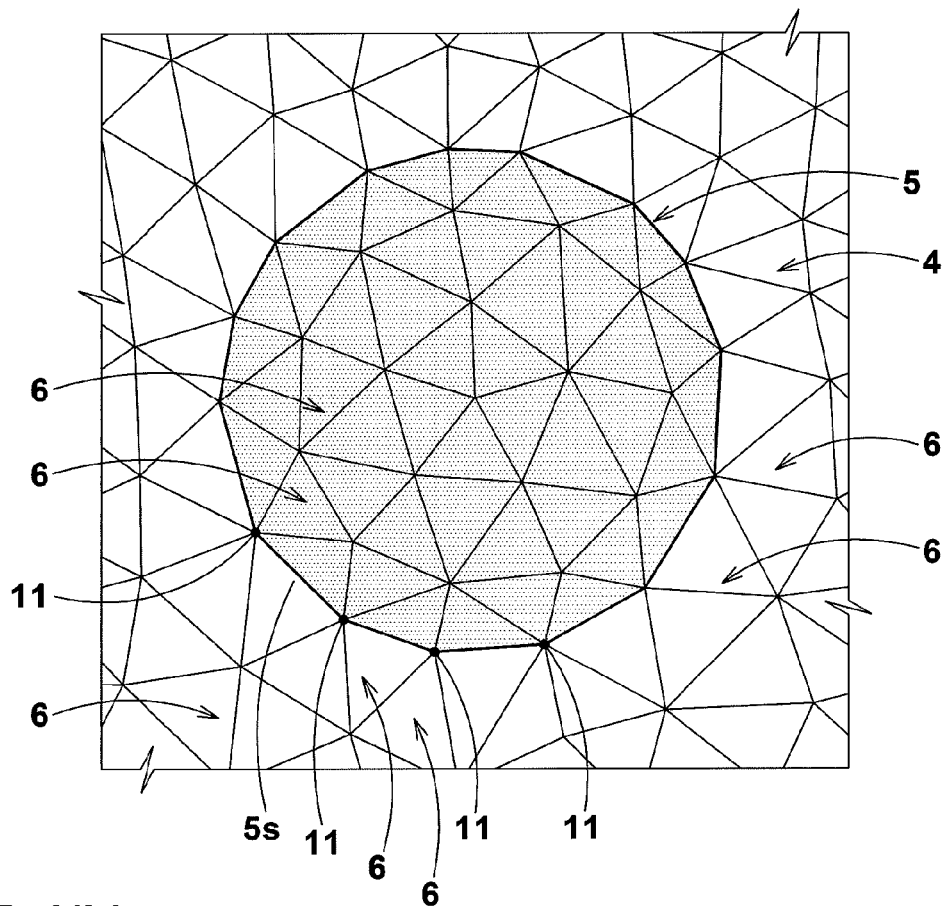
FIG. 4(a) shows a two-dimensional primary finite element model of a rubber composite of the rubber matrix and the fillers which is meshed with triangular elements.
Figure 4B:
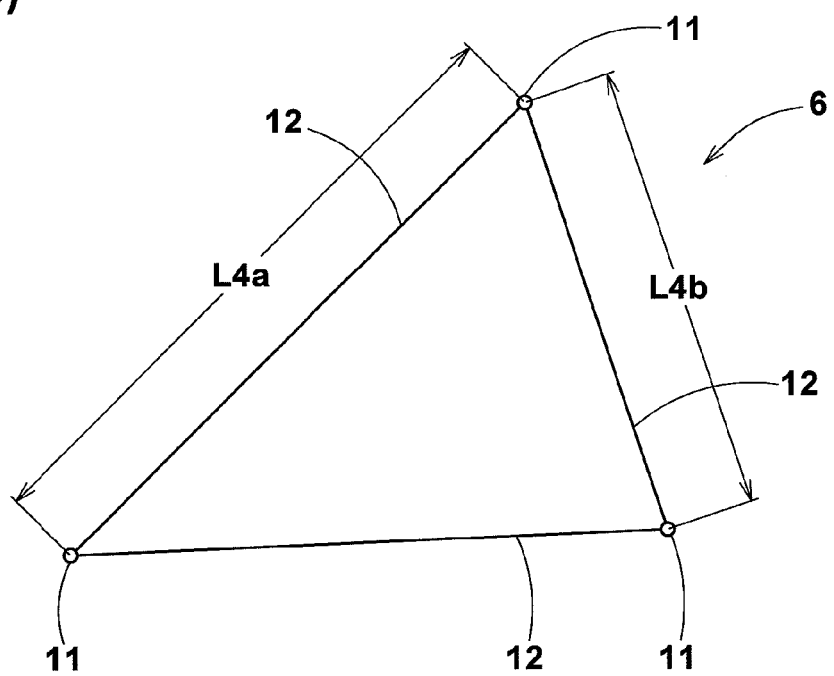
FIG. 4(b) is a closeup of FIG. 4(a) showing a triangular element.

In the second step S2, with the computer 1, the rubber matrix's region 4 and fillers' regions 5 are meshed with triangular elements 6 to create a two-dimensional primary finite element model as shown in FIG. 4(a), wherein as shown in FIG. 4(b), the triangular elements 6 each have three nodes 11 and three straight sides 12 extending between the nodes 11. The triangular elements 6 may include those having different sizes and/or shapes.

More specifically, as shown in FIG. 4(a), with the computer 1, nodes 11 which become boundary nodes between the rubber matrix and filler are arranged along the contour 5s of each filler region 5 (namely, the boundary between the filler region 5 and the rubber matrix's region 4), and the filler region 5 is divided into a plurality of triangular elements 6 based on these nodes 11.

Further, based on these nodes 11 disposed on the contours 5s of the fillers' regions 5, the rubber matrix's region 4 is also divided into a plurality of triangular elements 6.

The computer 1 stores the coordinates of all of the nodes 11 in the memory.

Figure 5B:
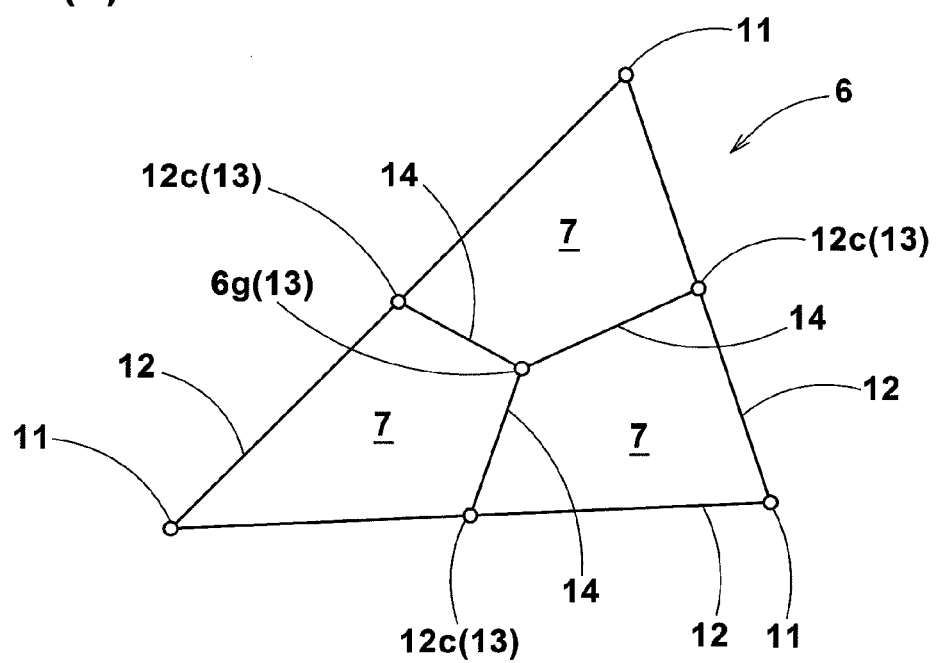
FIG. 5(b) is a closeup of FIG. 4(5) showing the triangular element subdivided into three quadrilateral elements.

In the third step S3, as shown in FIGS. 5(a) and 5(b), with the computer 1, each of the triangular elements 6 of the rubber matrix's region 4 and fillers' regions 5 is subdivided into three quadrilateral elements 7.

As shown in FIG. 5(b), additional nodes 13 are created on each triangular element 6, and additional sides 14 extending between the additional nodes 13 are defined.

More specifically, based on the coordinates of the three nodes of each triangular element 6, the centroid 6g of the triangular element 6 concerned and the three midpoint 12c of each of the three sides 12 thereof are calculated by the computer 1, and the additional nodes 13 are created at the centroid 6g and three midpoints 12c. Then, the computer 1 defines the three additional sides 14 as extending straight between the node 13 at the centroid 6g and the three nodes 13 at the three midpoints 12c. Thereby, each triangular element 6 is subdivided into three quadrilateral elements 7 each having four nodes 11, 13, 13 and 13 and four sides 12, 12, 14 and 14 extending therebetween.

On each quadrilateral element 7 of the rubber matrix's region 4 and fillers' regions 5, information necessary for numerical analyses made by a computer simulation is defined. The numerical analyses means a numerical analysis method such as finite element method. The information necessary for the analyses includes at least the coordinates and indexes (identification numbers) of the nodes 11 and 13 of each triangular element 6.

Further, on each quadrilateral element 7, material characteristics (physical properties) of the part corresponding to the concerned element 7 are defined.

Specifically, on each of the quadrilateral elements 7 of the rubber matrix's region 4, material constants corresponding to physical properties of the rubber matrix are defined.

On each of the quadrilateral elements 7 of the filler region 5, material constants corresponding to physical properties of the fillers are defined.

The computer 1 stores these data in the memory.

Thus, the two-dimensional finite element model 2 in this embodiment is created.

As explained above, in the case of the triangular elements 6, even if the fillers' regions 5 have complicated shapes, the fillers' regions 5 and the rubber matrix's region 4 inclusive of the parts in the vicinity of the contours 5s of the fillers' regions 5 can be divided relatively easily in a short time.

Test Results

Figure 6:
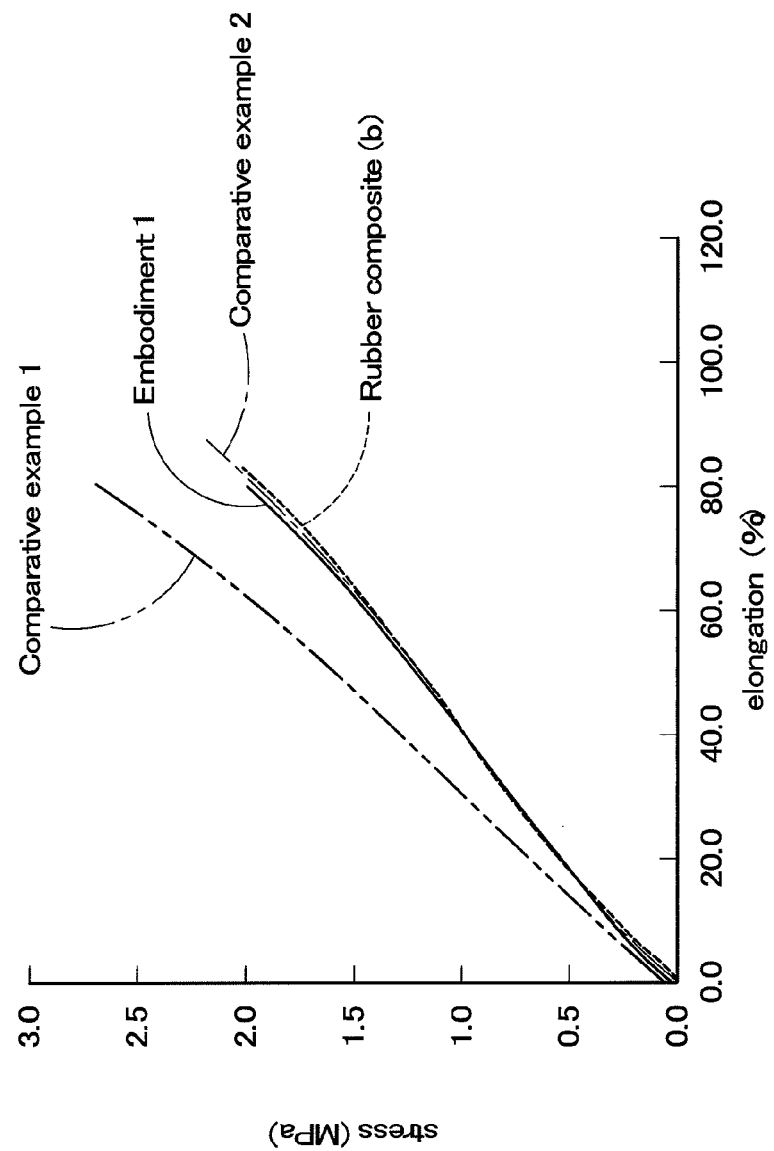
FIG. 6 is a graph showing a stress-elongation curve of a real rubber composite and those obtained by computer simulations.
Figure 14:
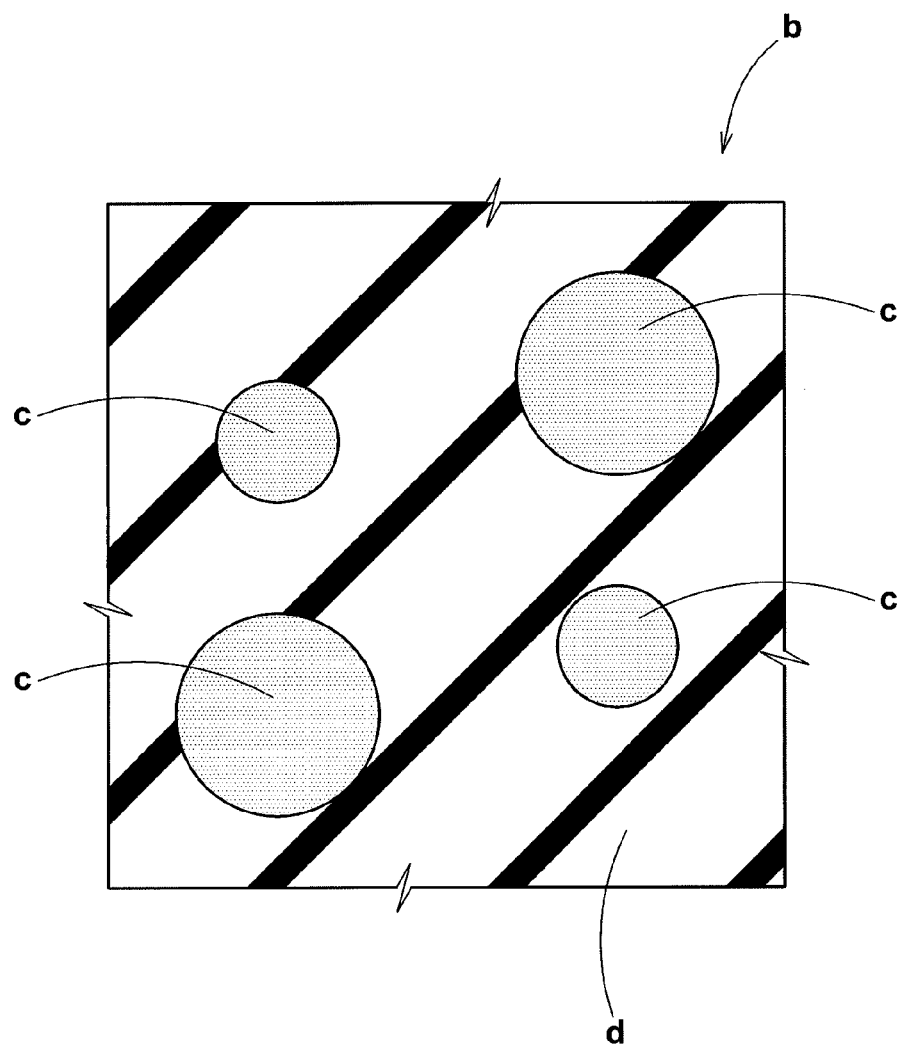
FIG. 14 is a diagrammatic cross sectional view showing the rubber composite.
Figure 15A:
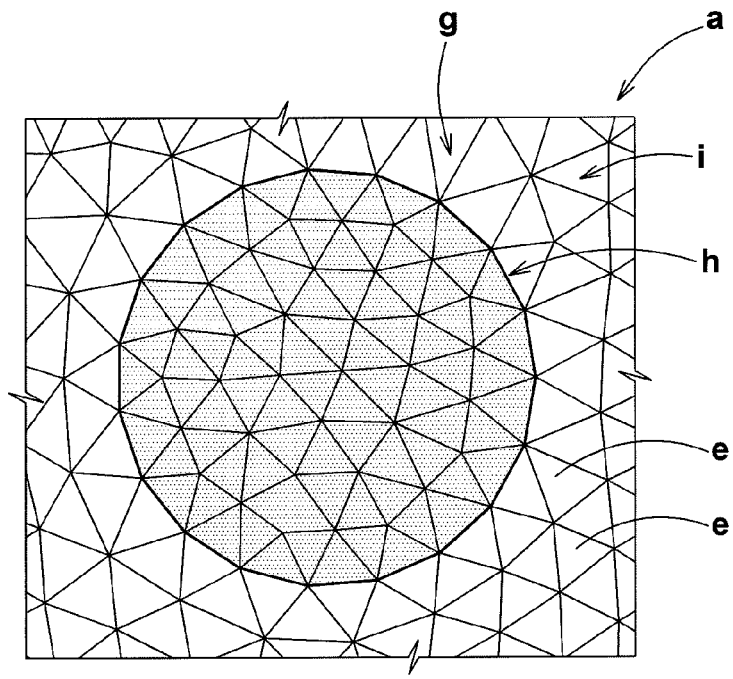
FIG. 15(a) shows a two-dimensional finite element model made up of triangular elements.
Figure 15B:
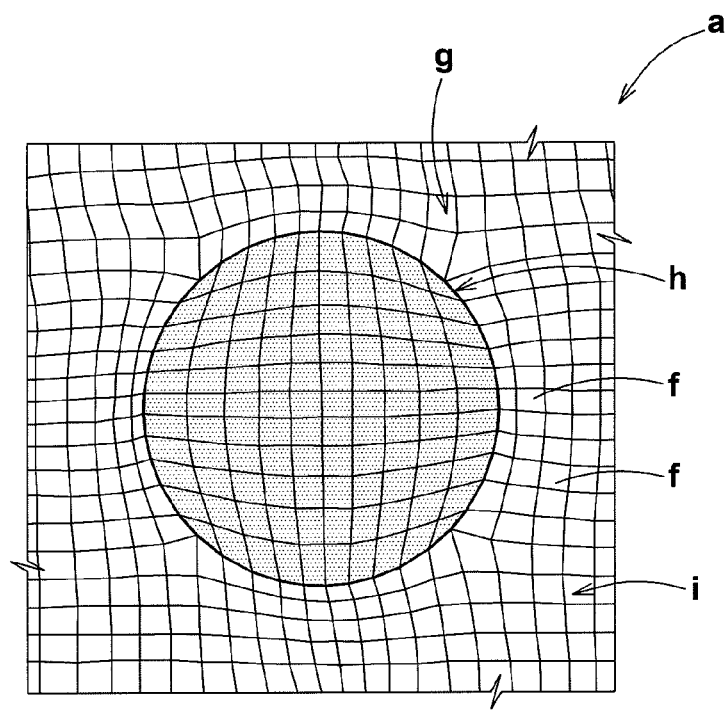
FIG. 15(b) shows a two-dimensional finite element model made up of quadrilateral elements.

For example, the rubber composite (b) shown in FIG. 14 displays a stress-elongation curve shown in FIG. 6 in broken line together with a stress-elongation curve obtained through a computer simulation utilizing the finite element model 2 in this embodiment (Embodiment 1) shown in FIG. 5(*a*) (number of elements: 2982), a stress-elongation curve obtained through the computer simulation utilizing the finite element model (comparative example 1) meshed with triangular elements only as shown in FIG. 15(*a*) (number of elements: 3252), and a stress-elongation curve obtained through the computer simulation utilizing the finite element model (comparative example 2) meshed with quadrilateral elements only as shown in FIG. 15(*b*) (number of elements: 4552).

The following table shows the processing time required to create the finite element model, starting from the two-dimensional space in which the regions of the fillers and the rubber matrix have been defined as shown in FIG. 3. The processing time is indicate by an index based on comparative example 1 being 100. The smaller the index number, the shorted the processing time.

| Model | processing time |
|---|---|
| Embodiment 1 | 120 |
| comparative example 1 | 100 |
| comparative example 2 | 182 |

These simulation results show that the simulation accuracy of Embodiment 1 is superior to that of the comparative example 1.

In the second step S2 in the first embodiment, in order to form the two-dimensional primary finite element model, the rubber matrix's region 4 and fillers' regions 5 are meshed with triangular elements 6 only.

Figure 7A:
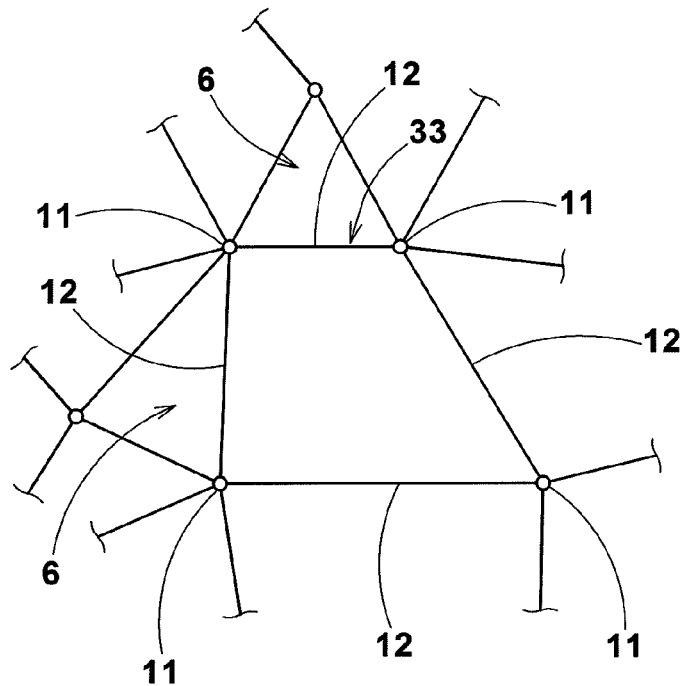
FIG. 7(a) shows a part of another example of the two-dimensional primary finite element model meshed with mainly triangular elements and large quadrilateral elements.
Figure 7B:
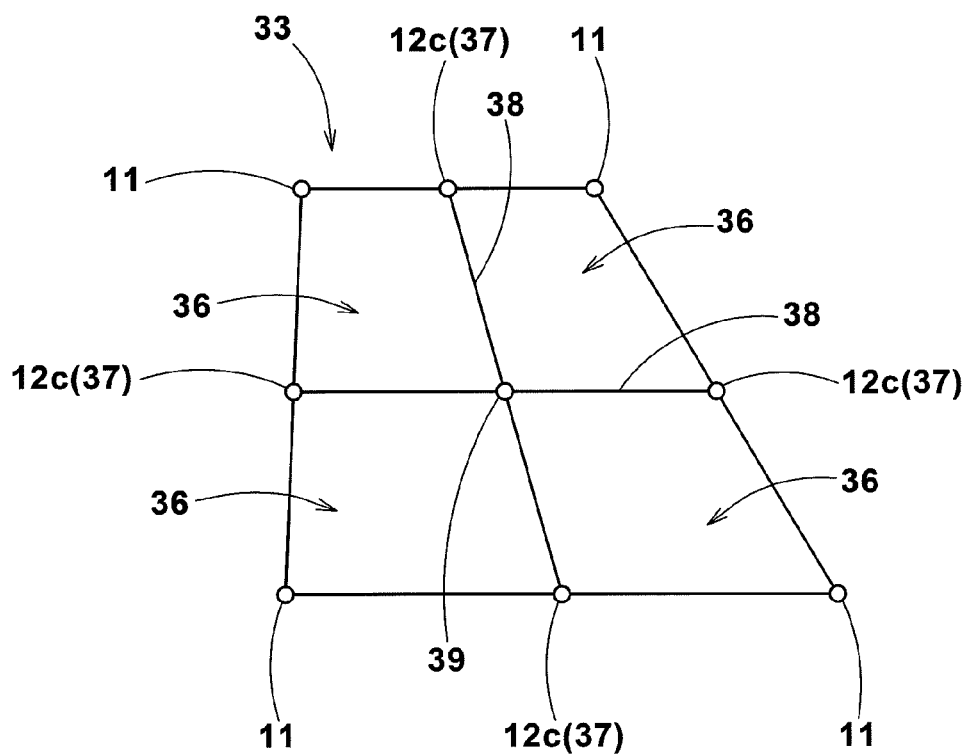
FIG. 7(b) shows one of the large quadrilateral elements which is subdivided into four small quadrilateral elements.

But, as shown in FIG. 7(*a*) partly, quadrilateral elements 33 may be used together with the triangular elements 6 in order to form the two-dimensional primary finite element model as far as the number of the quadrilateral elements 33 is less than the number of the triangular elements 6.

The quadrilateral element 33 has four nodes 11 and four straight sides 12 extending between the four nodes 11.

In this case, in the third step S3, each of the quadrilateral elements 33 is subdivided into four quadrilateral elements 36 as shown in FIG. 7(*b*).

More specifically, based on the coordinates of the four nodes 11 of each quadrilateral element 33, the computer 1 defines additional four nodes 37 at the midpoints 12c of the four sides 12 of the quadrilateral element 33, and additional two sides 38 extending between the opposite nodes 37, and further, an additional node 39 at the intersecting point of the additional two sides 38. Thereby, each quadrilateral element 33 is subdivided into four quadrilateral elements 36 having four nodes 11, 37, 37 and 39 and four sides 12 and 38 extending therebetween.

Accordingly, in this case too, the final finite element model 2 is made up of the quadrilateral elements only.

In any case, with respect to the total number of the triangular elements 6 of the two-dimensional primary finite element model as shown in FIG. 4(*a*), it is desirable that 95% or more of the triangular elements 6 each have a length ratio (L4*a*/L4*b*) of not more than 10, more preferably not more than 2, wherein the length ratio (L4*a*/L4*b*) is defined as the ratio of the length L4*a* of the longest side to the length L4*b* the shortest side of the triangular element 6.

Therefore, the aspect ratios of the subdivided quadrilateral elements 7 become close to 1, and even if one of the sides of a quadrilateral element 7 is constrained, sufficient deformation of the quadrilateral element 7 is allowed, and the simulation accuracy can be improved. Further, it is possible to divide the rubber matrix's region 4 and fillers' regions 5 more flexibly and effectively so that the creating the finite element model becomes more effective and the processing time can be reduced.

Second Embodiment

Three-Dimensional Finite Element Model 20

Figure 11:
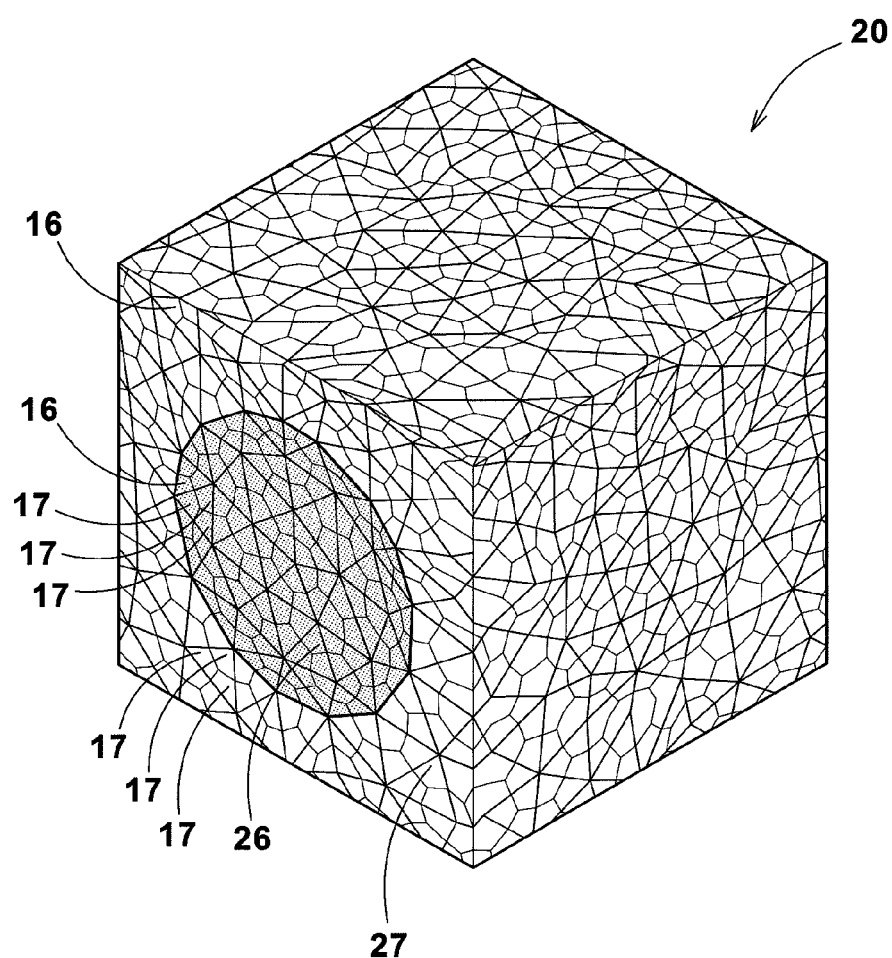
FIG. 11 is a perspective view showing the three-dimensional finite element model.

In the method according to the second embodiment of the present invention, a three-dimensional finite element model 20 (as shown in FIG. 11) of the rubber composite (b) (as shown in FIG. 14) is created.

Figure 8:
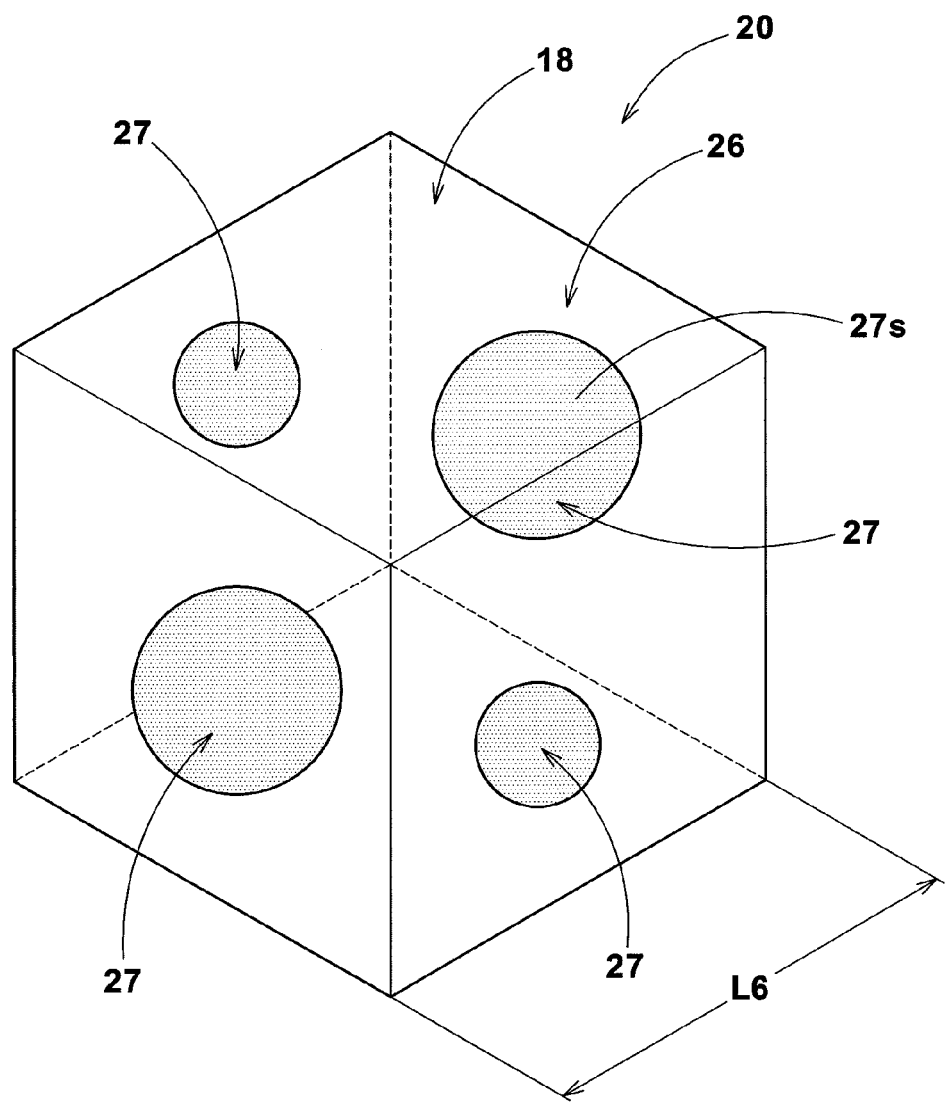
FIG. 8 is a perspective view showing a three-dimensional space.

In the first step S1 in this embodiment, a region 26 of the rubber matrix (d) and a plurality of regions 27 of the fillers (c) are defined in a predetermined three-dimensional space 18 (as shown in FIG. 8).

For example, the three-dimensional space 18 has a cubic shape of which each side has a length L6 of about 50 to 150 nm.

With the computer 1, the coordinates of each region 26, 27 are stored in the memory.

Figure 9:
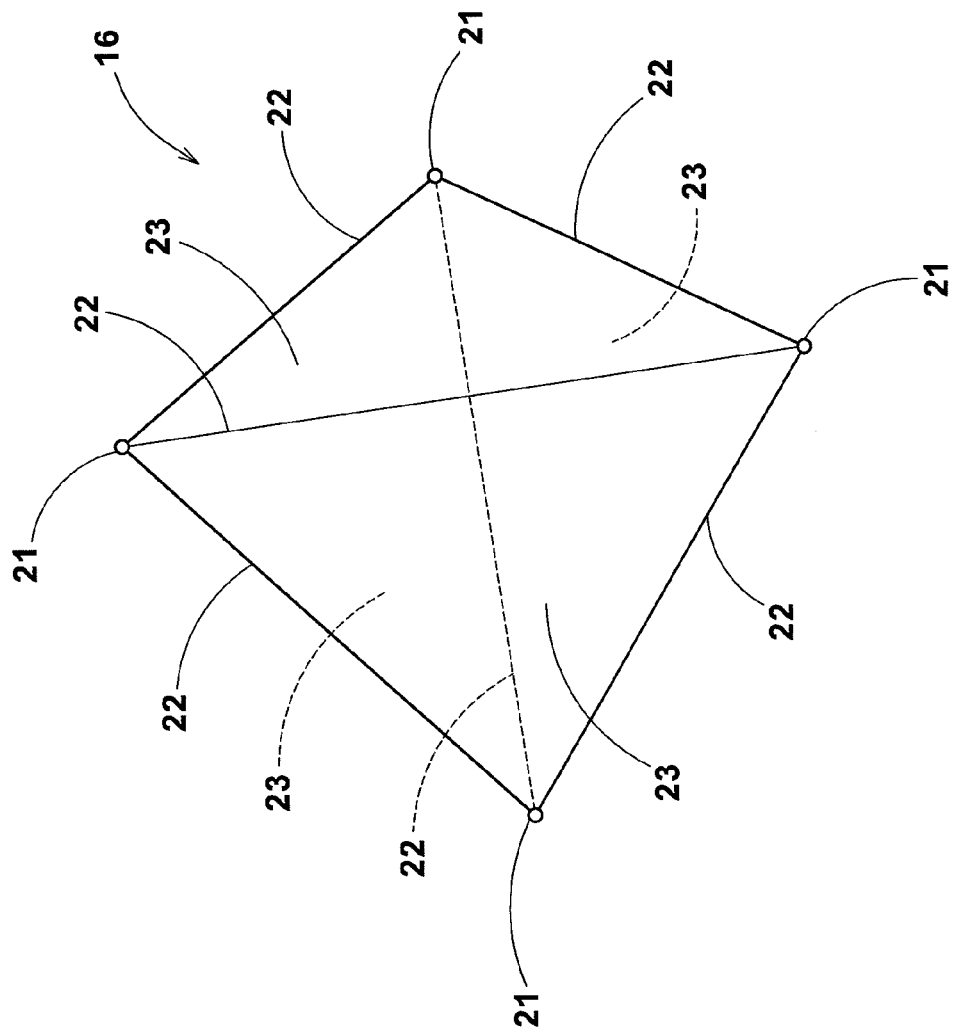
FIG. 9 is a perspective view showing a tetrahedral element.

In the second step S2 in this embodiment, with the computer 1, each of the rubber matrix's region 26 and the fillers' regions 27 is divided into tetrahedral elements 16 to create a three-dimensional primary finite element model (not shown), wherein as shown in FIG. 9, the tetrahedral elements 16 each have four nodes 21 and six straight sides 22 extending between the four nodes 21 and four faces 23 each surrounded by three of the six sides 22.

The tetrahedral elements 16 may include those having different sizes and/or shapes. More specifically, with the computer 1, faces 23 which become boundary faces 23 between the filler and the rubber matrix are arranged on the contour 27s of each filler region 27, and the filler region 27 is divided into a plurality of tetrahedral elements 16 based on these faces 23. Further, based on these faces 23 disposed on the contours 27s of the fillers' regions 27, the rubber matrix's region 26 is also divided into a plurality of tetrahedral elements 16.

The computer 1 stores the coordinates of all of the nodes 21 in the memory.

Figure 10:
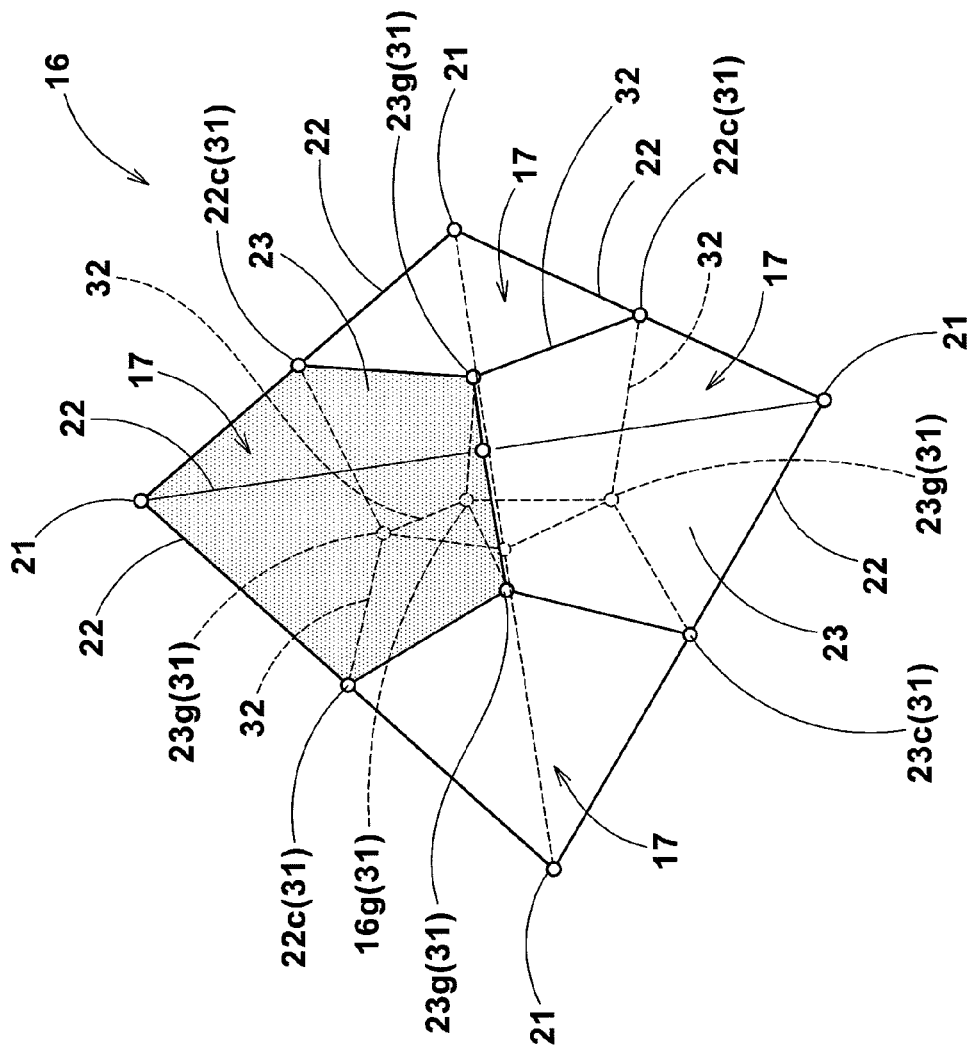
FIG. 10 is a perspective view showing the tetrahedral element subdivided into hexahedron elements.

In the third step S3 in this embodiment, with the computer 1, each of the tetrahedral elements 16 of the rubber matrix's region 26 and fillers' regions 27 is subdivided into four hexahedron elements 17. As shown in FIG. 10, additional nodes 31 are created on each tetrahedral element 16, and additional sides 32 extended between the additional nodes 31 are defined.

More specifically, based on the coordinate of the four nodes 21 of the tetrahedral element 16, the centroid 16g of the tetrahedral element 16, the centroid 23g of each of the four faces 23 and the midpoint 22c of the length of each of the six sides 22 are found by the computer 1 and the additional nodes 31 are created at the centroid 16g, four centroid 23g, and six midpoint 22c.

Then, the computer 1 define additional sides 32 as extending straight between the node 31 at the centroid 23g and the node 31 at the midpoint 22c and between the node 31 at the centroid 16g and the node 31 at the centroid 23g.

Thereby, each tetrahedral element 16 is subdivided into four hexahedron elements 17 each having eight nodes 21 and 31, twelve sides 22 and 32 extending therebetween and six faces 23.

On each hexahedron element 17 of the rubber matrix's region and fillers' regions, information necessary for numerical analyses made by a computer simulation is defined.

The information necessary for the analyses includes at least the coordinates and indexes (identification numbers) of the nodes 21 and 31 of each hexahedron element 17.

Further, material constants corresponding to the physical properties of the rubber matrix (d) or filler (c) are defined and stored in the memory of the computer 1.

Thus, the three-dimensional finite element model 20 in this an embodiment is created as shown in FIG. 11.

Test Results

Figure 12:
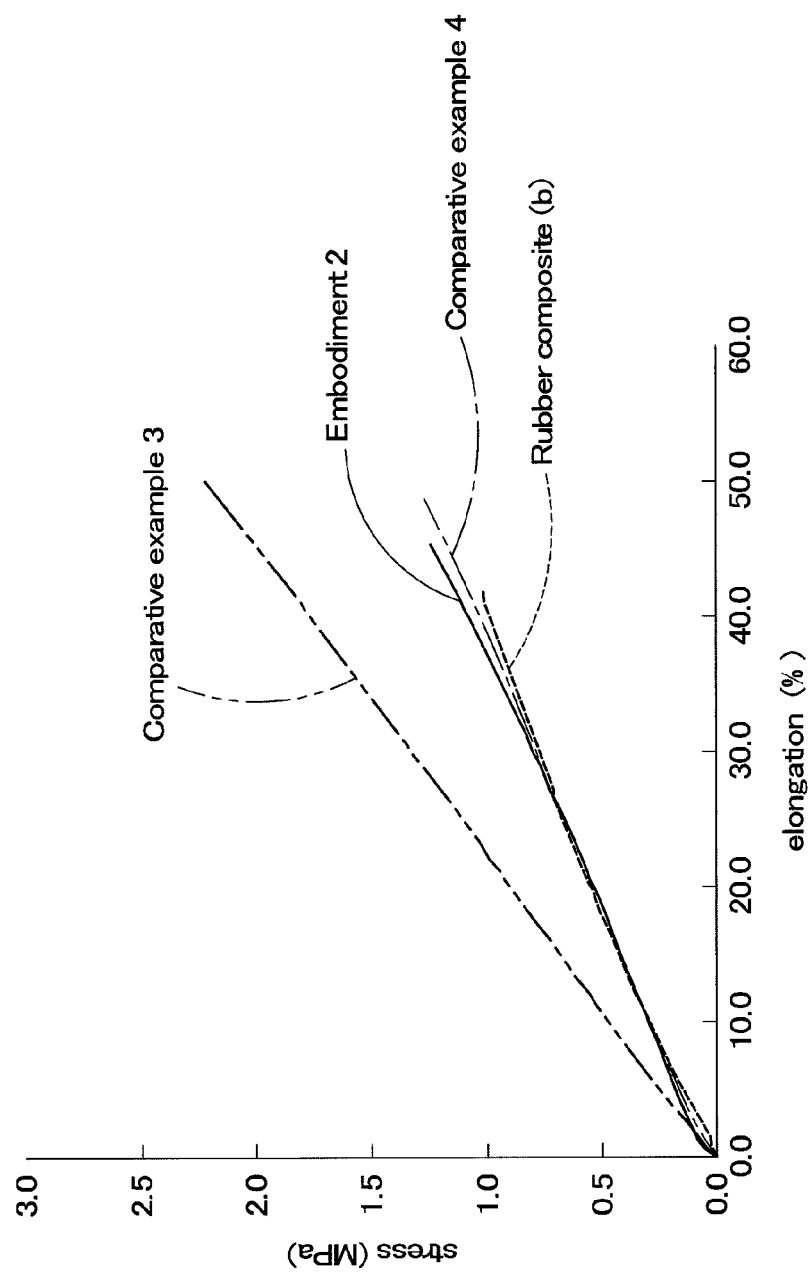
FIG. 12 is a graph showing the stress-elongation curve of the real rubber composite and those obtained by computer simulations.
Figure 13A:
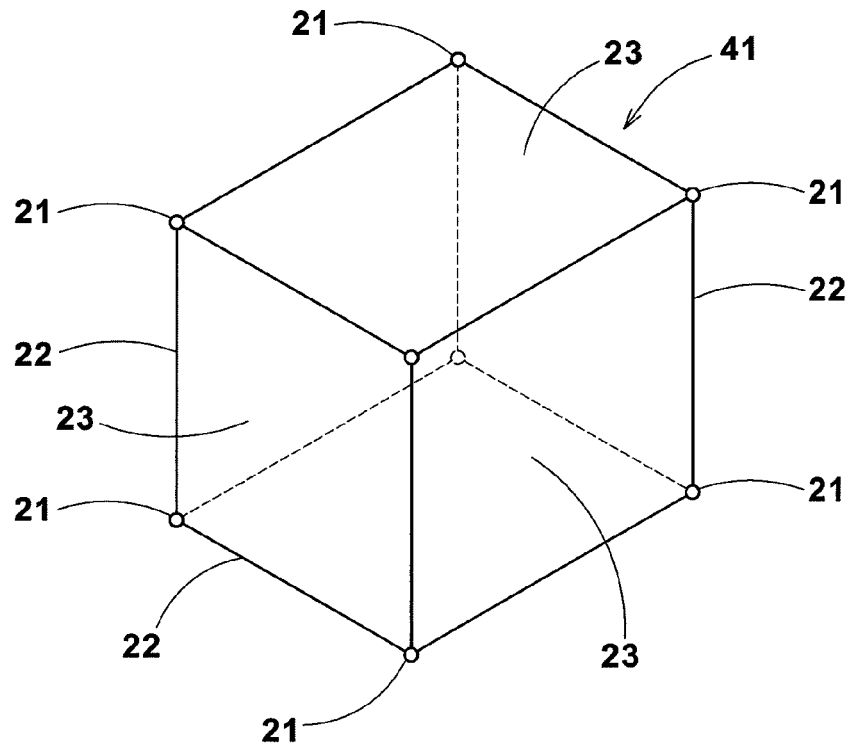
FIG. 13(a) is a perspective view showing a cubic element.
Figure 13B:
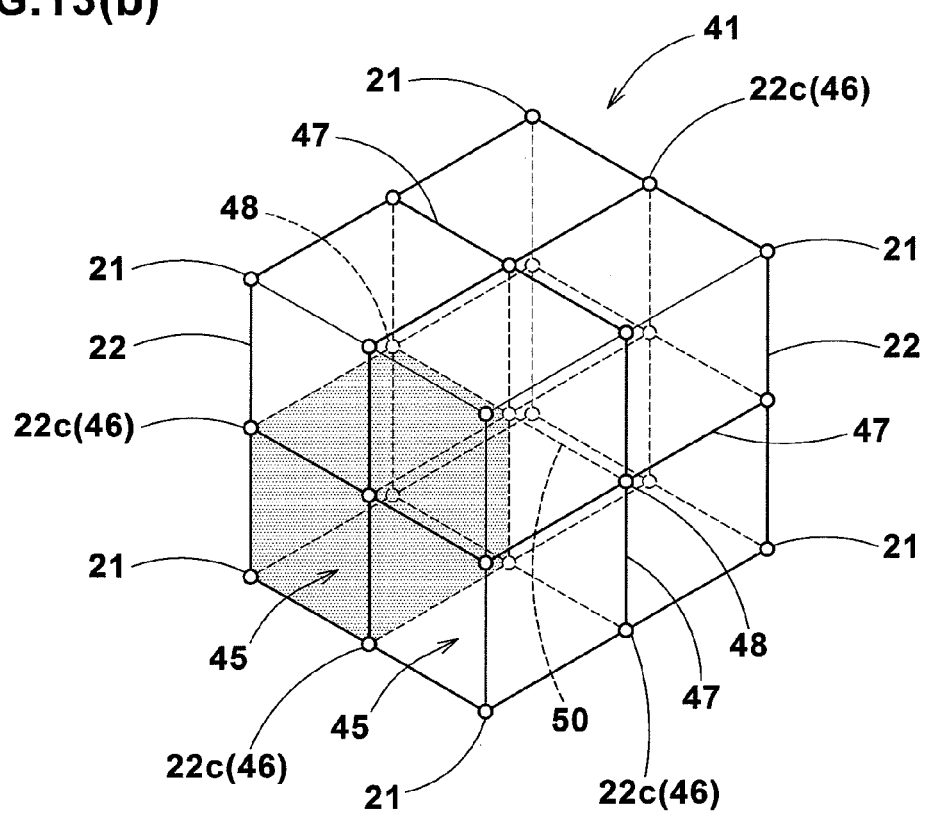
FIG. 13(b) is a perspective view showing the cubic element subdivided into small cubic elements.

FIG. 12 shows the stress-elongation curve of the actual rubber composite (b) shown in FIG. 14 together with a stress-elongation curve obtained through a computer simulation utilizing the finite element model 20 in this embodiment (Embodiment 2) shown in FIG. 11 (number of elements: 51920), a stress-elongation curve obtained through a computer simulation utilizing a finite element model meshed with tetrahedral elements only (comparative example 3) shown in FIG. 15(a) (number of elements: 193330), and a finite element model meshed with hexahedron elements only (comparative example 4) as shown in FIG. 13(b) (number of elements: 175616).

The following table shows the processing time required to create the finite element model, starting from the three-dimensional space in which the regions of the fillers and the rubber matrix have been defined as shown in FIG. 8. The processing time is indicate by an index based on comparative example 3 being 100. The smaller the index number, the shorted the processing time.

| model | processing time |
|---|---|
| comparative example 3 | 100 |
| comparative example 4 | 205 |
| Embodiment 2 | 78 |

These simulation results show that the simulation accuracy of Embodiment 2 is superior to those of the comparative examples.

In the second step S2 in the second embodiment, in order to create the three-dimensional primary finite element model (not shown), the rubber matrix's region 4 and fillers' regions 5 are meshed with tetrahedral elements 16 only.

But, hexahedron elements 41 as shown in FIG. 13(a) may be used together with the tetrahedral elements 16 as far as the number of the hexahedron elements 41 is less than the number of the tetrahedral element 16.

The hexahedron element 41 has eight nodes 21 and twelve sides 22 extending therebetween and fix faces 23.

In this case, in the third step S3, as shown in FIG. 13(b), each of the hexahedron elements 41 is subdivided into eight hexahedron elements 45. Specifically, the computer 1 finds the midpoint 22c of the length of each of the twelve sides 22 of the hexahedron element 41, and creates twelve additional nodes 46 at the twelve midpoints 22c, and defines additional sides 47 extending straight between the additional nodes 46, and defines additional sides 50 extending straight between intersecting points 48 between the additional sides 47.

Thereby, the hexahedron elements 41 are each subdivided into eight hexahedron elements 45 each having nodes 21 and 46 and sides 22, 47 and 50 extending therebetween.

Accordingly, in this case too, the final finite element model 20 is made up of the hexahedron elements only.

Therefore, it is possible to divide the rubber matrix's region 4 and fillers' regions 5 more flexibly and effectively so that the creating the finite element model becomes more effective and the processing time can be reduced.

The invention claimed is:

1. A computerized method for creating a two-dimensional finite element model of a rubber composite of a rubber matrix and fillers, comprising:

a first step in which a region of the rubber matrix and a plurality of regions of the fillers are defined in a predetermined two-dimensional space, and coordinates of these regions defined are stored in a memory of a computer, a second step in which, with the computer, each of the rubber matrix's region and the fillers' regions is divided into a plurality of triangular elements to define a two-dimensional primary finite element model of the rubber composite, wherein the two-dimensional primary finite element model consists of the triangular elements only, and with respect to the total number of the triangular elements of the two-dimensional primary finite element model, at least 95% of the triangular elements each have a longest side whose length is L4a and a shortest side whose length is L4b, and a length ratio L4a/L4b is not more than 2, a third step in which, with the computer, each of the triangular elements of the two-dimensional primary finite element model is subdivided into three quadrilateral elements to define the two-dimensional finite element model made up of the quadrilateral elements only, and a fourth step in which a computer simulation utilizing the defined two-dimensional finite element model made up of the quadrilateral element is performed to obtain and display a relationship between stress and elongation of the rubber composite.

2. The method according to claim 1, wherein in the third step, the subdividing of the triangular element into the three quadrilateral elements is made such that, with the computer, the centroid of the triangular element and the midpoint of the length of each of the three sides of the triangular element are found, and four additional nodes are defined at the centroid and the three midpoints, and three additional sides extending between the additional nodes are defined.

* * * * *